(12) United States Patent
Hantschel et al.

(10) Patent No.: US 8,435,612 B2
(45) Date of Patent: May 7, 2013

(54) MICRO-MACHINED STRUCTURE PRODUCTION USING ENCAPSULATION

(75) Inventors: Thomas Hantschel, Menlo Park, CA (US); Sven Kosgalwies, Dresden (DE); Eugene M. Chow, Mountain View, CA (US); Gordon Todd Jagerson, Jr., Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/248,660

(22) Filed: Sep. 29, 2011

(65) Prior Publication Data

US 2012/0021170 A1    Jan. 26, 2012

Related U.S. Application Data

(60) Division of application No. 12/728,047, filed on Mar. 19, 2010, now Pat. No. 8,080,293, which is a division of application No. 12/037,890, filed on Feb. 26, 2008, now Pat. No. 7,730,615, which is a continuation of application No. 10/986,712, filed on Nov. 12, 2004, now Pat. No. 7,356,920.

(51) Int. Cl.
   *B32B 3/22*    (2006.01)

(52) U.S. Cl.
   USPC .......... 428/34.1; 138/103; 138/106; 138/177; 174/60; 174/259; 428/34.6; 428/81

(58) Field of Classification Search .................. 428/34.1, 428/34.6; 138/103, 106, 177; 174/259, 260; 439/81

See application file for complete search history.

(56) References Cited

U.S. PATENT DOCUMENTS

| | | | |
|---|---|---|---|
| 5,200,248 A | 4/1993 | Thompson et al. | |
| 5,613,861 A | 3/1997 | Smith et al. | |
| 5,719,073 A | 2/1998 | Shaw et al. | |
| 6,184,053 B1 | 2/2001 | Eldridge et al. | |
| 6,290,510 B1 | 9/2001 | Fork et al. | |
| 6,766,817 B2 | 7/2004 | da Silva | |
| 7,015,584 B2 | 3/2006 | Chow et al. | |
| 7,356,920 B2 | 4/2008 | Hantschel et al. | |
| 2002/0102091 A1* | 8/2002 | Mizuno et al. | 385/146 |

* cited by examiner

*Primary Examiner* — Brent O'Hern
(74) *Attorney, Agent, or Firm* — Bever, Hoffman & Harms, LLP; Patrick T. Bever (57) ABSTRACT

Micro-machined (e.g., stress-engineered spring) structures are produced by forming a release layer, forming a partially or fully encapsulated beam/spring structure, and then releasing the beam/spring structure by etching the release layer. The encapsulation structure protects the beam/spring during release, so both the release layer and the beam/spring can be formed using plating and/or using the same material. The encapsulation structure can be metal, resist, polymer, oxide, or nitride, and may be removed after the release process, or retained as part of the completed micro-machined structure.

16 Claims, 9 Drawing Sheets

MICRO-MACHINED STRUCTURE PRODUCTION USING ENCAPSULATION

RELATED APPLICATIONS

This application is a divisional of U.S. patent application Ser. No. 12/728,047, entitled "Micro-Machined Structure Production Using Encapsulation" filed Mar. 19, 2010 which is a divisional of U.S. patent application Ser. No. 12/037,890, entitled "Micro-Machined Structure Production Using Encapsulation" filed Feb. 26, 2008, now U.S. Pat. No. 7,730,615 which is a continuation of U.S. patent application Ser. No. 10/986,712, entitled "Micro-Machined Structure Production Using Encapsulation" filed Nov. 12, 2004, now U.S. Pat. No. 7,356,920.

FIELD OF THE INVENTION

The present invention is directed to micro-machined structures, and in particular to micro-machined structures in which a beam is supported over a substrate surface such that an air-gap is defined between the beam and the substrate.

BACKGROUND OF THE INVENTION

Photo lithographically patterned spring structures (sometimes referred to as "micro-springs") represent one type of micro-machined structure that has been developed, for example, to produce low cost probe cards, and to provide electrical connections between integrated circuits. Conventional spring structures include a spring metal finger (beam) having a flat anchor portion secured to a substrate, and a curved free portion extending from the anchor portion and bending away from the substrate (i.e., such that an air-gap is defined between the tip of the spring metal finger and the substrate to which the anchor portion is attached). The spring metal finger is formed from a stress-engineered metal film (i.e., a metal film fabricated such that its lower portions have a different internal compressive stress than its upper portions) that is at least partially formed on a release material layer. The free portion of the spring metal finger bends away from the substrate when the release material located under the spring finger is etched away. The internal stress gradient is produced in the spring metal by layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, and actuated mirrors. For example, when utilized in a probe card application, the tip of the spring is brought into contact with a contact pad formed on an integrated circuit, and signals are passed between the integrated circuit and test equipment via the probe card (i.e., using the spring metal structure as a conductor). Other examples of such spring structures are disclosed in U.S. Pat. No. 3,842,189 (Southgate) and U.S. Pat. No. 5,613,861 (Smith).

The stress-engineered metal films used to form conventional spring structures were originally formed by sputtering deposition methods, but more recently plating deposition methods have been developed that produce suitable stress-engineered films. Those skilled in the art will appreciate the significant cost savings associated with using plating techniques, as opposed to sputter techniques, to fabricate the stress-engineered films. However, although modifying the spring production process to include plating the stress-engineered films reduces the overall costs significantly (i.e., no expensive stressed metal sputter machine needed), the existing technology still relies on depositing the release material by other methods such as sputtering (e.g., when titanium (Ti) is used as the release material) or plasma-enhanced-vapor-deposition (PECVD) (e.g., when silicon (Si) is used as the release material). Furthermore, a plating seed layer (e.g., Au) is typically required to facilitate the plating process, and this seed layer is typically sputter deposited over the release layer before stressed-metal plating. Thus, although the ability to form stress-engineered spring structures using plating deposition techniques reduces production costs, the need for expensive sputter deposition equipment is still required. Further, the ability to eliminate sputter deposition and to implement a plating-only production process is very difficult to achieve with the current spring materials due to the limited material choice (e.g., nickel (Ni), copper (Cu), gold (Au), nickel-phosphorous (NiP) alloy or nickel-boron (NiB) alloy) for plating, and associated etch selectivity problems. Note that fabrication costs are especially important in the targeted application areas such as packaging, probing and interconnects.

What is needed is a spring production method that utilizes plating deposition techniques to form the release layer, plating seed layer (when used), and the spring (e.g., stress-engineered metal) film.

SUMMARY OF THE INVENTION

The present invention is directed to a method for producing micro-machined (e.g., stress-engineered spring) structures in which a beam is supported over a substrate surface such that an air-gap is defined between the beam and the substrate. In particular, the beam is formed on a sacrificial release layer, an encapsulation structure is formed on at least the side edges of the beam, and then the release layer material located under a portion of the beam is removed using an etchant to form the air-gap. The encapsulating structure is formed from a material that is not dissolved by the etchant, thereby preventing damage to the beam/spring during the release process. The thickness of the encapsulation structure can be determined by the choice of materials used. In one embodiment, the encapsulation material may be a metal (e.g., Au), resist, or a polymer formed to a thickness of 0.1 to 1 μm. Alternatively, the encapsulation layer may be relatively thin (e.g., 5-100 nm) and be formed from an oxide or nitride. The resulting micro-machined structure includes the beam/spring supported such that an air-gap is formed between a portion of the beam/spring and the underlying substrate.

In accordance with an aspect of the present invention, the encapsulating material facilitates the formation of the entire spring structure (i.e., release layer, seed layer, and beam/spring) using relatively inexpensive plating techniques. That is, conventional spring structure fabrication methods required using relatively expensive sputtering techniques to form release layers, which increased overall production costs. The encapsulation structure prevents etching/damage to the beam/spring during the release process, thus allowing etching of the release layer without risk to the beam/spring, thereby allowing the beam/spring to be formed using plated release materials, thus significantly reducing overall manufacturing costs.

In accordance with another aspect of the present invention, the encapsulating material facilitates the formation of the release layer and the beam/spring using the same or similar materials. That is, by utilizing the encapsulation structure to prevent etching of the beam/spring during release, selectivity problems associated with using the same release/spring material are avoided, thereby facilitating the formation of both the release layer and the beam/spring using the same material (e.g., a plated metal such as Ni, or a sputtered metal/alloy such as MoCr). Alternatively, the beam may be formed using plated Ni or another stress-engineered metal, and the release layer formed using NiP or NIB.

According to an embodiment of the present invention, the micro-machined structure comprises a spring structure produced using a stress-engineered film that is deposited over the release layer using the methods mentioned above. After release, the stress-engineered beam/spring finger is bent using known mechanisms to form a curved spring finger that can be used as a probe or interconnect structure. In alternative embodiments, the micro-machined structure may include a straight (i.e., non-stress engineered) cantilevered beam structure or simply supported air-bridge structure. The encapsulation structure can be maintained on the beam as part of the completed micro-machined structure, or can be removed after the release process. In yet another embodiment, after the release process, the beam material may be partially or fully etched or otherwise removed from the inside of a full encapsulation structure, thereby leaving a hollow capillary structure formed solely by the encapsulation material.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to micro-machined structures in which a beam structure is supported over a substrate surface in such a manner that an air-gap is defined between the beam and the substrate. As used herein, the term "air-gap" refers to a region containing a vacuum or gas (e.g., air) that is formed between two substantially solid (e.g., metal) structures when a solid "sacrificial" material is removed (e.g., etched) from the region. The following paragraphs describe spring-type, straight cantilever type and air-bridge type micro-machined structures. The production method associated with the present invention is then described with particular reference to spring structures. However, unless otherwise specified in the claims, the production method is intended to cover any of the micro-machined structure types set forth below.

Figure 1A:
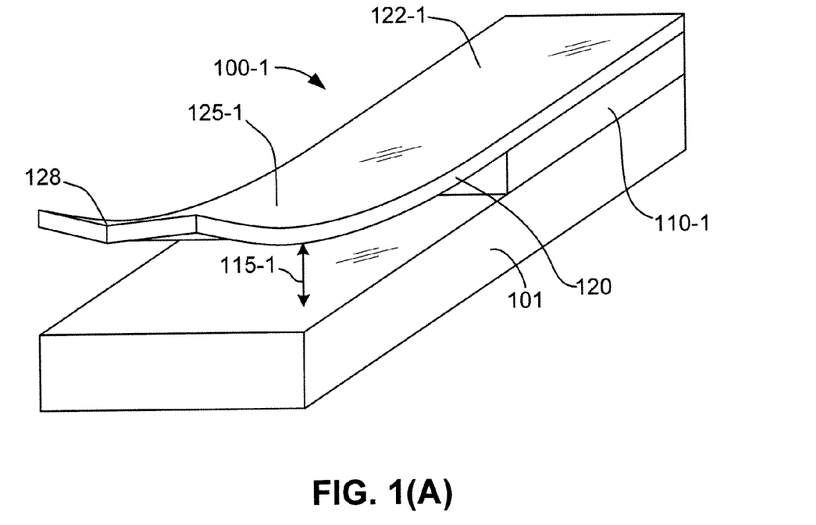
FIGS. 1(A) and 1(B) are perspective and cross-sectional side views showing a spring-type micro-machined structure formed using the production method of the present invention.
Figure 1B:
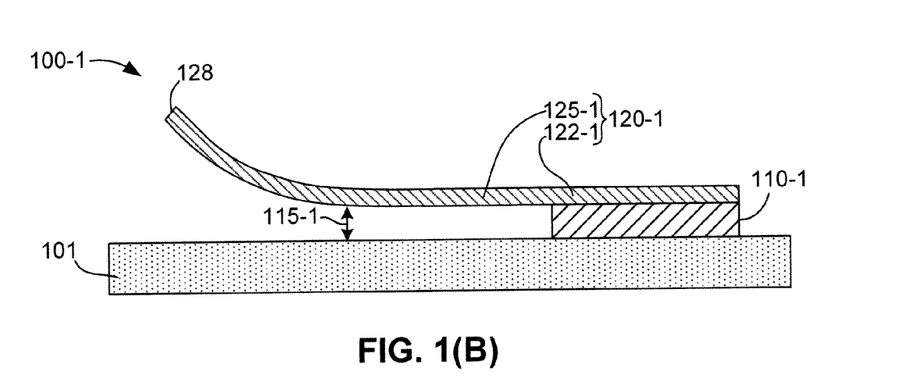

FIG. 1(A) is a perspective view showing a micro-machined spring structure 100-1, which represents one type of micromachined structure formed in accordance with the method of the present invention. FIG. 1(B) is a cross-sectional side view showing spring structure 100-1 in additional detail. Spring structure 100-1 includes a spring finger (beam) 120-1 that is mounted on a substrate 101 by way of a base section 110-1 such that an air gap 115-1 is defined between substrate 101 and at least a portion of spring finger 120-1. In particular, spring finger 120 includes an anchor portion 122-1 attached to base section 110-1, and a curved free portion 125-1 that extends from anchor portion 122-1 and is separated from substrate 101 by an angled air-gap region 115-1 (i.e., a first gap adjacent to anchor portion 122-1, and a second (either larger or smaller) gap adjacent to free end (tip) 128). According to an aspect of the present invention, spring finger 120-1 is fabricated using a stress-engineered metal film that facilitates selective and controllable bending of the spring structure. The term "stress-engineered metal" or "stressy metal" is defined herein as a sputtered or plated metal film either including a non-zero internal stress gradient, or an intermetallic metal film formed in accordance with co-owned and co-pending U.S. patent application Ser. No. 10/912,418, entitled "Intermetallic Spring Structure", which is incorporated herein by reference. Spring metals may include non-metal components. In one embodiment, the stress-engineered film is formed such that its lowermost portions (i.e., the deposited material adjacent to base section 110-1) have a lower internal tensile stress than its upper portions (i.e., the horizontal layers located furthest from base section 110-1), thereby causing the stress-engineered metal film to have internal stress variations that cause a spring metal finger to bend upward away from substrate 101 during the subsequent release process.

Figure 2:
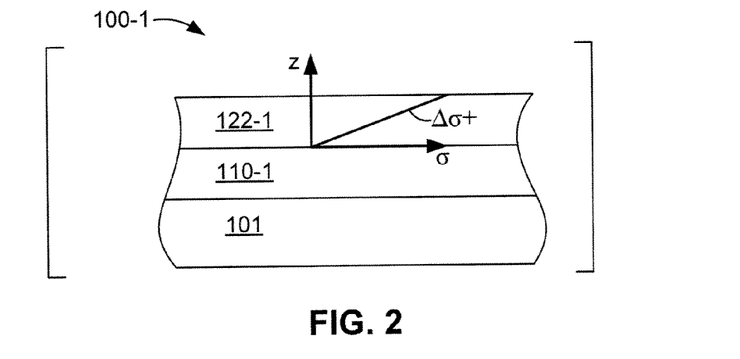
FIG. 2 is an enlarged cross-sectional side view showing a portion of the spring structure of FIG. 1(A)

FIG. 2 is a partial side view in which internal stress gradients are superimposed over portions of anchor portion 122-1 of spring structure 100-1 for illustrative purposes. As indicated in the lower portion of FIG. 2, unlike base section 110-1 which is formed without a significant stress gradient, anchor portion 122-1 is formed from a stress-engineered metal film (e.g., using sputtering or plating) that has a positive stress gradient Δσ+ (i.e., tending to bend the edges of anchor portion 122-1 away from substrate 101). Methods for generating such internal stress variations in stress-engineered metal films are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 0.05-0.2 micron titanium (Ti) release material layer, a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium (NiZr) alloy that are either sputter deposited or plated over the release material in the manner described above to a thickness of 0.3-2.0 micron. An optional metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve the resistance and wear properties of the completed spring structure. In an alternative embodiment, a nickel (Ni), copper (Cu) or nickel-zirconium (NiZr) alloy film may be formed that can be directly plated without a seed layer. If electroless plating is used, the deposition of the electrode layer can be omitted. When a downward bending spring is desired, the positive stress gradient indicated in FIG. 2 is replaced with a negative stress gradient.

Figure 3:
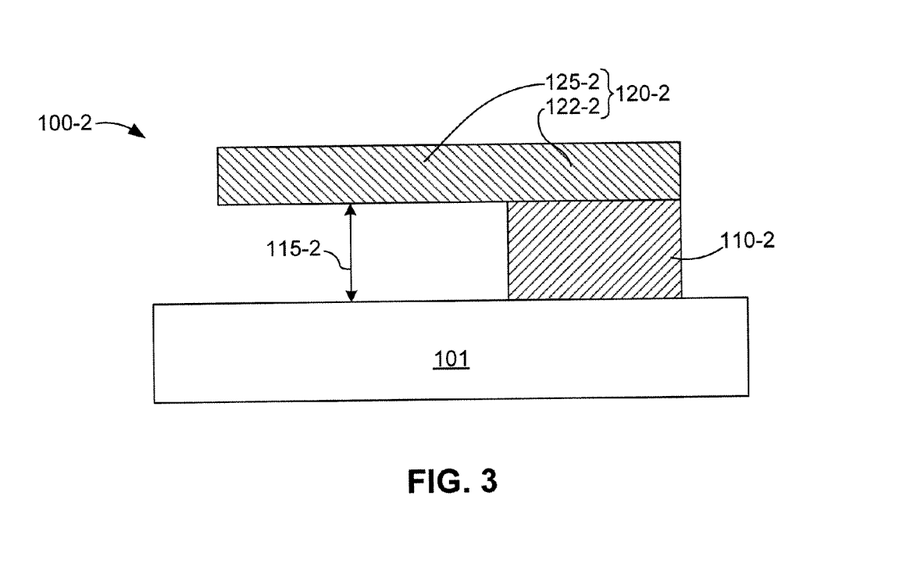
FIG. 3 is a simplified cross-sectional side view showing a second micro-machined structure formed using the production method of the present invention.
Figure 4:
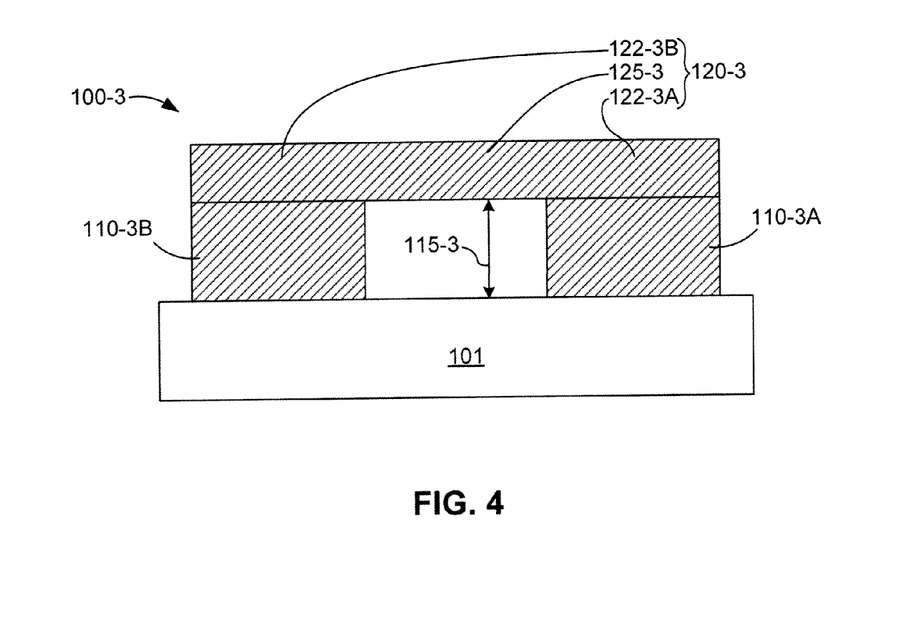
FIG. 4 is a simplified cross-sectional side view showing a third micro-machined structure formed using the production method of the present invention.

FIGS. 3 and 4 depict alternative micro-machined structures that may be formed using the production method of the present invention (discussed below). In FIG. 3, a straight cantilevered structure 100-2 includes a beam 120-2 having an anchor portion 122-2 mounted on a base section 110-2, and a free portion 125-2 extending from anchor portion 122-2 and separated from an underlying substrate 101 by an air-gap 115-2 in a manner similar to that described above. However, straight cantilevered structure 100-2 differs from spring structure 100-1 in that beam 120-2 is formed without an internal stress-gradient, and therefore remains straight after release. FIG. 4 shows a simply supported "air-bridge" structure 100-3 including a beam 120-3 supported at a first end 122-3A by a first base section 110-3A, and at a second end 122-3B by a second base section 110-3B. A central freely supported section 125-3 of beam 120-3 is suspended over an underlying substrate 101 such that an air-gap 115-3 is defined therebetween.

Figure 5:
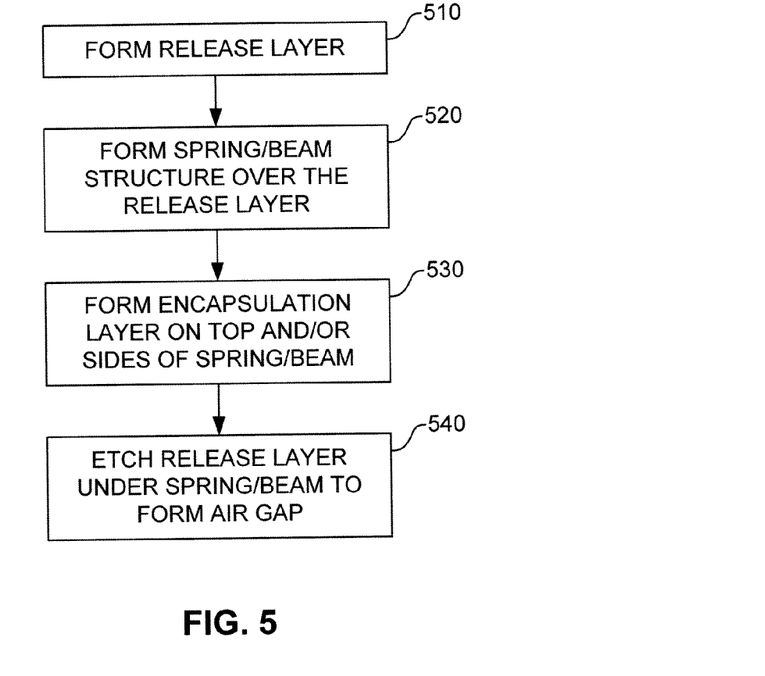
FIG. 5 is a flow diagram showing a production method according to an embodiment of the present invention.
Figure 6A:
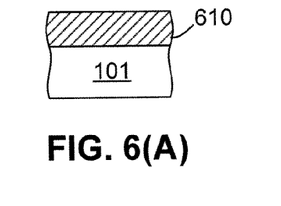
FIGS. 6(A), 6(B), 6(C) and 6(D) are cross-sectional side views showing a portion of a generalized micro-machined structure illustrating various stages the production method of FIG. 5.
Figure 6B:
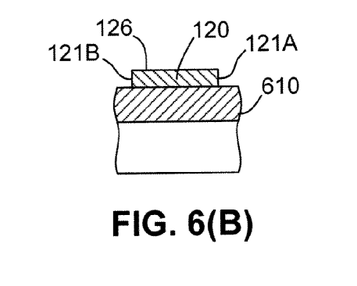
Figure 6C:
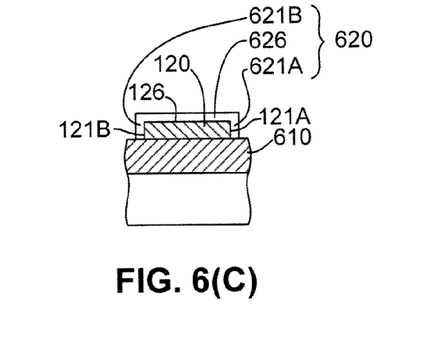
Figure 6D:
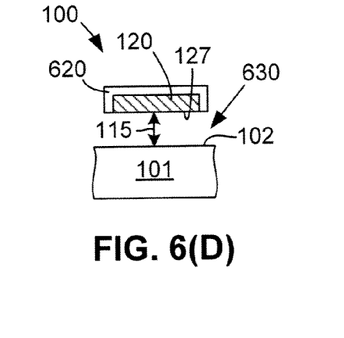

A method for producing micro-machined structures according to the present invention is depicted in the flow diagram of FIG. 5, and is explained by way of a specific example illustrated in FIGS. 6(A) through 6(D). Referring to the top of FIG. 5 and to FIG. 6(A), the process begins by forming a release layer 610 on/over substrate 101 (block 510). Next, as illustrated in FIG. 6(B), beam 120 is formed on/over release layer 610 such that beam 120 includes opposing side edges 121A, 121B and an upper surface 126 (block 520, FIG. 5). Next, as depicted in FIG. 6(C), an encapsulation structure 620 is formed on beam/spring structure 120 such that portions 621A and 621B respectively cover side edges 121A and 121B of beam 120, respectively, and an optional upper portion 626 of encapsulation structure 620 covers upper surface 126 of beam 120 (block 530, FIG. 5). Note that, as established in the additional embodiments set forth below, the formation of upper portion 626 of encapsulation structure 620 is optional, and an additional lower encapsulation layer portion (not shown) may be provided between beam 120 and release layer 610. Finally, as indicated in FIG. 6(D), an etchant 630 is used to remove the release material located under beam 120, thereby generating an air gap 115 between a lower surface 127 of beam 120 and an upper surface 102 of substrate 101. In particular, etchant 630 and encapsulation structure 620 are selected such that etching of beam 120 is prevented in portions that are protected by encapsulation structure 620 (i.e., at least side edges 121A and 121B, and upper surface 126 when optional upper portion 620 is provided. That is, release layer 610, beam 120, encapsulation structure 620 and etchant 630 are selected such that etchant 630 removes (dissolves) release layer 610, but cannot dissolve encapsulation structure 620, thereby preventing removal of beam 120. The resulting micro-machined structure 100, shown in FIG. 6(D), is embodied by any of the micro-machined structures described above (e.g., spring structure 100-1 (FIG. 1(A)), cantilevered beam structure 100-2 (FIG. 3), or bridge structure 100-3 (FIG. 4). In particular, the example depicted in FIG. 6(D) depicts a general case in which the resulting beam structure does not bend away from the substrate upon release (e.g., similar to the "straight" cantilever structure 100-2 (FIG. 3), the "air-bridge" structure 100-3 (FIG. 4), and spring structures that require subsequent processing (e.g., annealing) to effect the bending process). When conventional spring metals are used, air gap 115 shown in FIG. 6(D) is typically larger than the thickness of the etched release layer.

In accordance with an aspect of the present invention, the use of encapsulation structure 620 in the manner described above facilitates the formation of release layer 610 using relatively inexpensive plating techniques. That is, as described above, conventional spring structure fabrication methods required using relatively expensive sputtering techniques to form release layers, which increased overall production costs. By using encapsulation material to prevent etching/damage to the beam structure during the release process, etching of the release layer may proceed without risk to the beam structure, thus allowing the use of materials produced by plating techniques (i.e., as opposed to the conventional sputtered release materials). Accordingly, because release material layer 610 can be plated (as opposed to sputtered), the present invention facilitates the production of spring (micro-machined) structures in which both the release layer and the beam structure are formed by inexpensive plating techniques, thus significantly reducing overall manufacturing costs.

In accordance with another aspect of the present invention, the use of encapsulation structure 620 in the manner described above facilitates the formation of release layer 610 and beam 620 using substantially the same material (e.g., both the release layer and beam are formed using one of the common plating metals/alloys such as Ni, Cu, Au, NiP or NiB). As discussed above, this limited choice of suitable materials prevented plating both the release layer and beam structure by conventional production methods due to problems associated with selectively etching the release layer while leaving the beam structure (i.e., it was not possible to remove the release layer without etching the beam). In contrast, by utilizing encapsulation layer 620 to prevent etching of beam 120 during release, the present invention eliminates the selectivity problem, thereby facilitating the formation of both the release layer and the beam from a common material. As suggested above, in one embodiment both the release layer and the beam are formed by a single plated material (e.g., both the release layer and the beam comprise a Ni layer deposited by electroplating or electroless plating), thereby producing a relatively low-cost micro-machined structure. However, in another alternative embodiment, encapsulation structure 620 also facilitates relatively low-cost sputtering production of release layer 610 and beam 120 in that both of these structures can be formed using a single target (i.e., material source), thus greatly simplifying the sputtering process.

Various other features and aspects of forming micro-machined structures using encapsulation structures are also possible. For example, the encapsulation structure may be formed using one or more materials selected for thickness, convenience, and/or durability characteristics. Moreover, as suggested above, the encapsulation structure can be maintained on the beam as part of the completed micro-machined structure, the encapsulation structure can be removed after the release process, or the beam can be etched from the encapsulation layer to produce a micro-machined structure formed by the encapsulation structure. These and additional aspects and features associated with encapsulation structure formed in accordance with the present invention are described with reference to the additional specific embodiments set forth below.

Figure 7A:
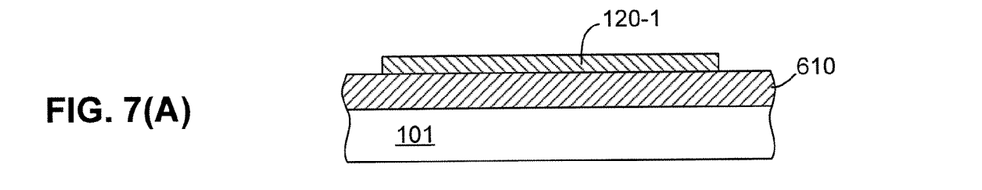
FIGS. 7(A), 7(B), 7(C), 7(D), 7(E) and 7(F) are cross-sectional side views showing a portion of a spring-type micro-machined structure illustrating various stages the production method of FIG. 5.
Figure 7B:
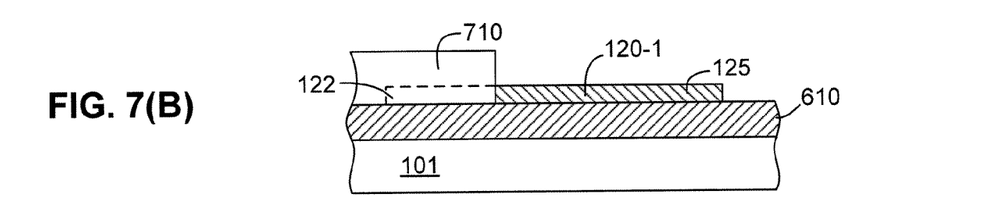
Figure 7C:
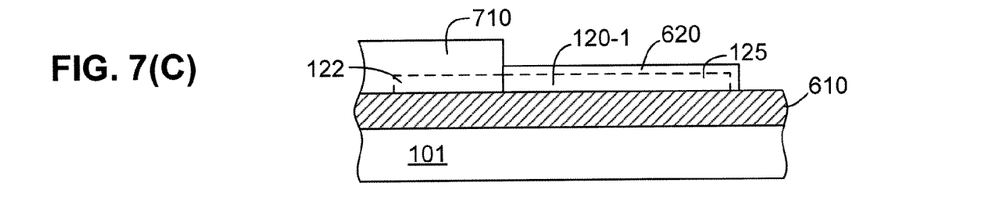
Figure 7D:
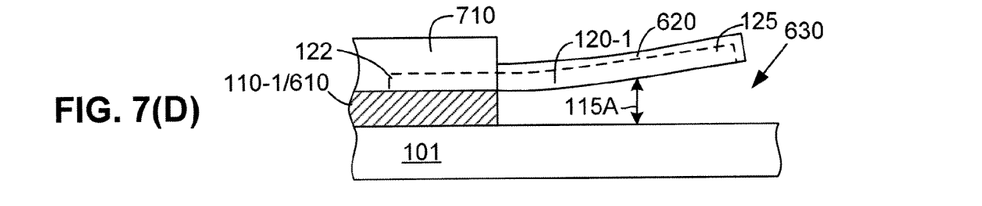
Figure 7E:
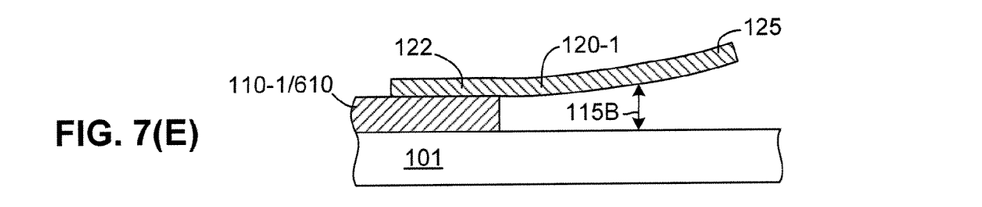
Figure 7F:
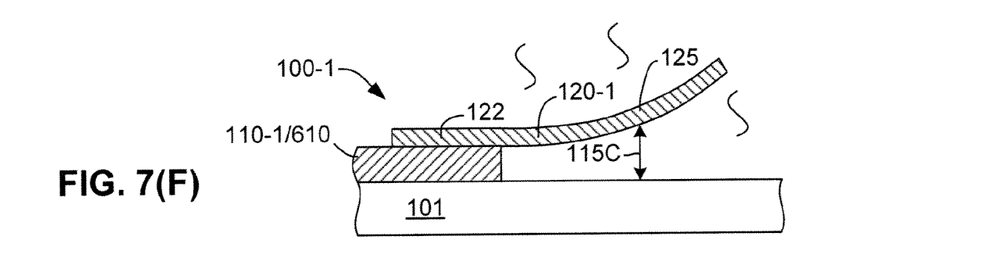

FIGS. 7(A) through 7(F) are simplified side views illustrating the production of a spring structure 100-1 (described above with reference to FIGS. 1(A), 1(B) and 2) using the production method shown and described with reference to FIGS. 6(A) to 6(D). Referring to FIG. 7(A), release layer 610 and stress-engineered beam 120-1 are formed using the methods mentioned above. As indicated in FIGS. 7(B) and 7(C), a release mask (resist) 710 is formed according to known techniques over anchor portion 122 of beam 120-1, and encapsulation structure 620 is formed over free portion 125 of beam 120-1. In an alternative embodiment, encapsulation structure 620 may be formed over the entire beam before formation of release mask 710. Next, as shown in FIG. 7(D), the release material located under free portion 125 is removed using etchant 630, thus forming an initial air-gap 115A caused in part by free portion 125 bending upward due to the internal stress gradient of beam 120-1. Note that, in addition to protection of beam 120-1 by encapsulation structure 620, release mask 710 prevents the removal of a portion of release layer 610 located under anchor portion 122, thereby forming base section 110-1. FIG. 7(E) illustrates the subsequent removal of the release mask and encapsulation material, which causes further self-bending of beam 120-1 to form a somewhat larger air gap 115B. FIG. 7(F) illustrates optional further processing (e.g., annealing) that completes the bending process and provides spring structure 100-1 with a final, maximum air gap 115C. These figures suggest that the bending process spontaneously occurs upon release and removal of the encapsulation material (e.g., characteristic of stress-engineered sputtered films). In an alternative embodiment, beam 120-1 may be formed using plated Ni or another stress-engineered metal and the release layer formed using NIP or NiB, and self-bending may be almost entirely controlled by annealing (e.g., after removal of the encapsulation layer). Moreover, the bending process may not occur at all (e.g., in cases where the produced micro-machined structure includes a straight beam, such as in the examples described above with reference to FIGS. 3 and 4).

Figure 8:
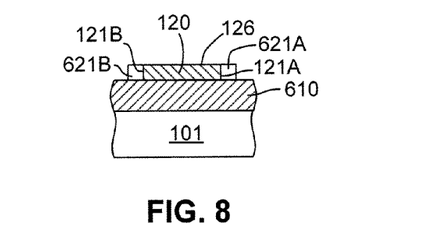
FIG. 8 is a cross-sectional side view showing a portion of a micro-machined structure including side-only encapsulation according to an embodiment of the present invention.

The generalized production method set forth in FIG. 5 may be used to perform the specific embodiments shown in FIGS. 6(A) to 6(D) and 7(A) to 7(E) if the beam material shows anisotropic etching behavior (i.e., the beam material is etched rapidly in the lateral direction (i.e., from the sides), but only slowly from the vertical direction (i.e., from the top/bottom surfaces). Under such anisotropic etching conditions, it is also possible to omit the release layer portion formed over the upper surface of the beam (e.g., encapsulation layer portion 626, shown in FIG. 6(C)). The resulting encapsulation structure is shown in FIG. 8, where encapsulation portions 621A and 621B cover side edges 121A and 121B, respectively, of beam 120, but upper surface 126 remains exposed to the etchant during the release process, which is not affected by the anisotropic etching process.

Figure 9A:
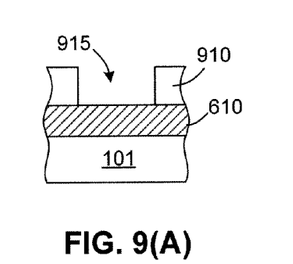
FIGS. 9(A), 9(B), 9(C), 9(D), 9(E), 9(F), 9(G), 9(H) and 9(I) are cross-sectional side views showing a portion of a spring-type micro-machined structure illustrating various stages of a full encapsulation production method according to another embodiment of the present invention.
Figure 9B:
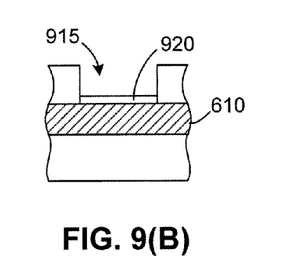
Figure 9C:
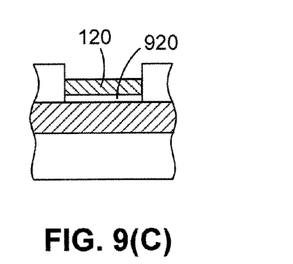
Figure 9D:
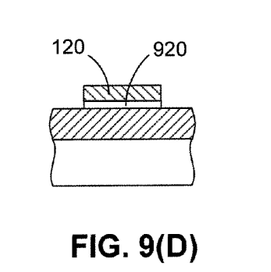
Figure 9E:
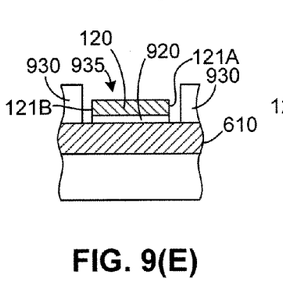
Figure 9F:
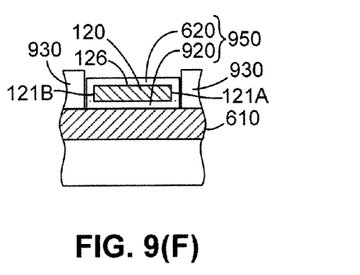
Figure 9G:
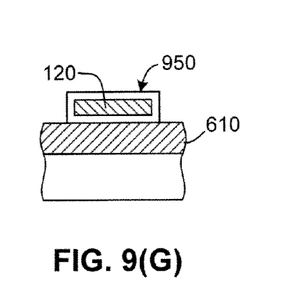
Figure 9H:
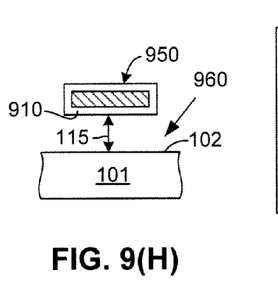
Figure 9I:
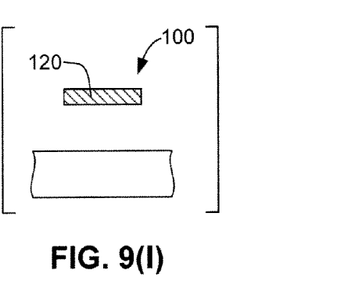

FIGS. 9(A) through 9(I) are simplified cross-sectional end views illustrating a method for producing a micro-machined structure using full encapsulation according to another embodiment of the present invention. Full encapsulation may be used, for example, when isotropic etching is utilized during the release process, but may also be used to produce capillary structures (discussed below). Referring to FIG. 9(A), after forming release layer 610 (e.g., plated Ni) on substrate 101 in the manner described above, a first mask 910 is lithographically patterned to define a window 915 exposing an upper surface area of release layer 610 corresponding to the desired beam width. In FIG. 9(B), a lower encapsulation layer 920 (e.g., plated Au) is deposited through window 915 onto the exposed area of release layer 610, and in FIG. 9(C) beam 120 (e.g., plated Ni) is formed on lower encapsulation layer 920. The first mask is then removed (FIG. 9(D)), and then a second mask 930 is patterned on release layer 610 (FIG. 9(E)). Second mask 930 defines a window 935 that is wider than beam 120, thereby exposing side edges 121A and 121B of beam 120 and corresponding side edges of lower encapsulation layer 920. In FIG. 9(F), an upper encapsulation structure 620 (e.g., plated Au) is formed through window 935 over beam 120 such that, as described above with reference to FIG. 6(C), portions of upper encapsulation structure 620 cover side edges 121A and 121B and upper surface 126 of beam 120. Note that the lower side edges of upper encapsulation structure 620 are formed on the outer edges of lower encapsulation layer 920, thereby forming a full encapsulation structure 950 around beam 120. Lower encapsulation layer 920 and upper encapsulation layer 620 may be formed using the same or different encapsulation materials. In FIG. 9(G), at least a portion of the second mask is removed such that sections of release layer 610 located adjacent to beam 120 and full encapsulation structure 950 are exposed. An etchant 960 is then utilized to remove this adjacent release material (FIG. 9(H)), thereby forming air-gap 115 between lower encapsulation layer 910 of full encapsulation structure 950 and upper surface 102 of substrate 101. Finally, in FIG. 9(I), the full encapsulation structure is optionally removed, thereby completing production of micro-spring structure 100. As set forth in the example above, an advantage of the full encapsulation method is that micro-spring structure 100 may be formed using only two materials (e.g., Ni and Au), both of which can be formed using inexpensive plating techniques. Further, the high etch selectivity between beam 120 and release layer 610, which is required to produce such structures using conventional methods, is not required in the present embodiment due to the protection provided by full encapsulation structure 950.

In accordance with yet another aspect of the invention, the thickness of the encapsulation structure can be determined by the choice of materials used. For example, the encapsulation material may be relatively thick (e.g., 0.1-1 μm) and formed from a metal (e.g., Au), resist, or a polymer. Alternatively, the encapsulation layer may be relatively thin (e.g., 5-100 nm) and be made for example from oxides or nitrides. Moreover, as suggested above, the encapsulation layer can be maintained on the beam as part of the completed micro-machined structure, or can be removed after the release process. These and additional aspects and features associated with encapsulation structure formed in accordance with the present invention are described with reference to the additional specific embodiments set forth below.

Figure 10A:
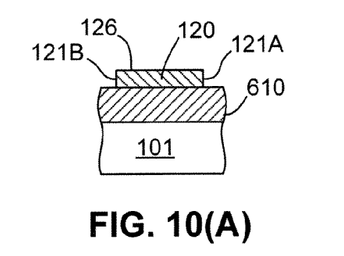
FIGS. 10(A), 10(B), 10(C) and 10(D) are cross-sectional side views showing a portion of a generalized micro-machined structure illustrating various stages of an oxide-based encapsulation production method according to another embodiment of the present invention.
Figure 10B:
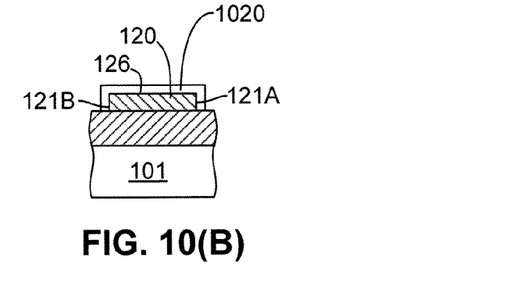
Figure 10C:
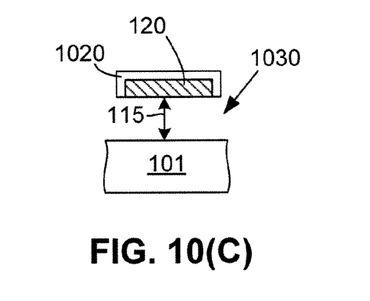
Figure 10D:
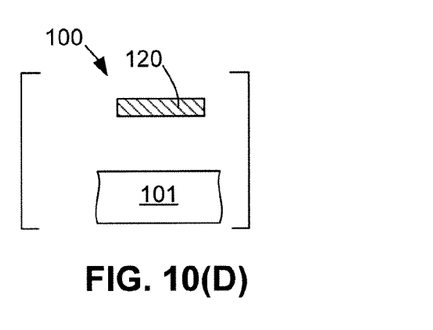

FIGS. 10(A) to 10(D) show another alternative embodiment in which an encapsulation structure includes an oxide or a nitride layer. In FIG. 10(A), a release layer 610 is formed over substrate 101 and a beam 120 is formed using the methods described above. Note that, unlike many of the preceding embodiments, release layer 610 and beam 120 are formed using different materials. For example, release layer 610 is formed using Ti, whereas beam 120 is formed using Ni or MoCr. In FIG. 10(B), an oxide-based or nitride-based encapsulation structure 1020 is formed (e.g., grown) on exposed surfaces (i.e., side edges 121A and 121B, and upper surface 126) of beam 120. In one embodiment, an oxide of the beam metal is grown by thermal oxidation using known techniques. In FIG. 10(C), the release layer is then isotropically etched to release beam 120 using an etchant 1030 to form air-gap 115, and in FIG. 10(D) the oxide/nitride-based encapsulation layer is removed using known techniques. An advantage of this embodiment is that formation of the encapsulation structure does not require an additional lithographic mask.

Figure 11A:
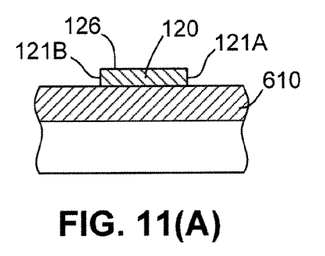
FIGS. 11(A), 11(B), 11(C) and 11(D) are cross-sectional side views showing a portion of a generalized micro-machined structure illustrating various stages of a resist-based encapsulation production method according to another embodiment of the present invention.
Figure 11B:
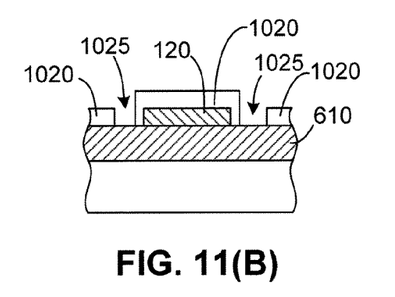
Figure 11C:
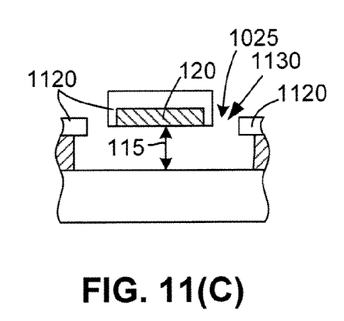
Figure 11D:
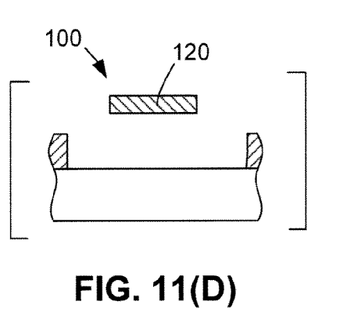

FIGS. 11(A) to 11(D) show another alternative embodiment in which an encapsulation structure includes a resist or a polymer that covers at least a part of the release mask. In FIG. 11(A), a release layer 610 is formed over substrate 101 and a beam 120 is formed using the methods described above. Note that release layer 610 and beam 120 may be formed using the same metal or different metals. In FIG. 11(B), a resist or polymer encapsulation structure 1020 is formed (e.g., deposited via spinning) on beam 120, and is patterned to include windows 1025 that expose portions of release layer 610 located adjacent to beam 120. In FIG. 11(D), the release layer is then isotropically etched using an etchant 1130 to release beam 120 to form air-gap 115, and in FIG. 11(D) the resist/polymer encapsulation layer is removed using known techniques. Similar to the oxide/nitride encapsulation embodiment, an advantage of this embodiment is that formation of the encapsulation structure may be performed during formation of the release mask, and thus does not require an additional lithographic step.

Figure 12A:
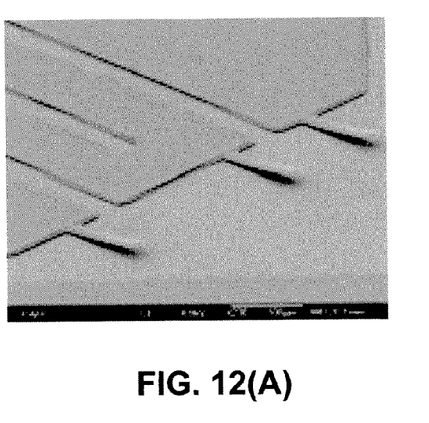
FIGS. 12(A), 12(B) and 12(C) are scanning electron microscopy (SEM) photographs showing spring structures formed in accordance with an embodiment of the present invention before removing the encapsulating structure.
Figure 12B:
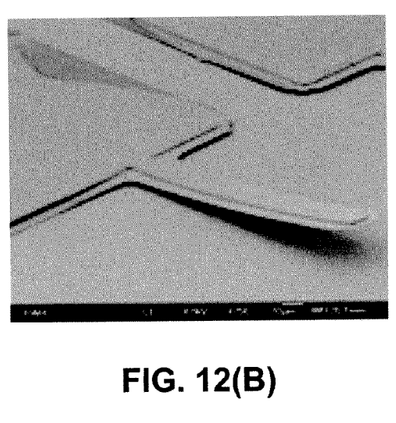
Figure 12C:
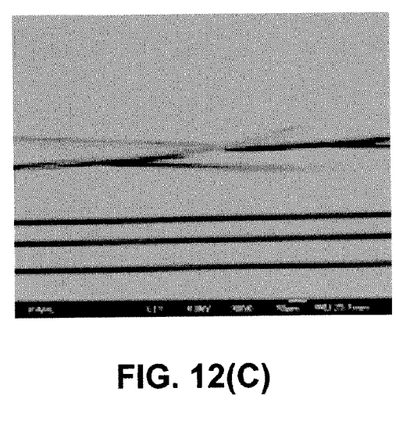
Figure 13A:
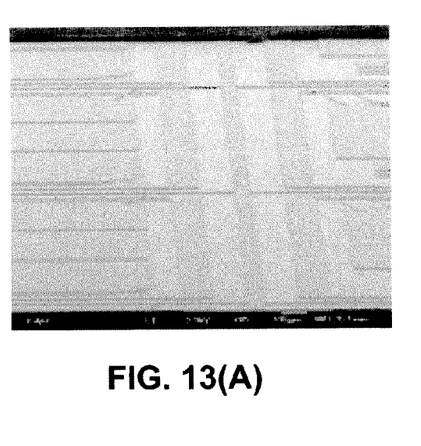
FIGS. 13(A), 13(B) and 13(C) are SEM photographs showing the spring structures of FIGS. 12(A), 12(B) and 12(C), respectively, after removing the encapsulating structure.
Figure 13B:
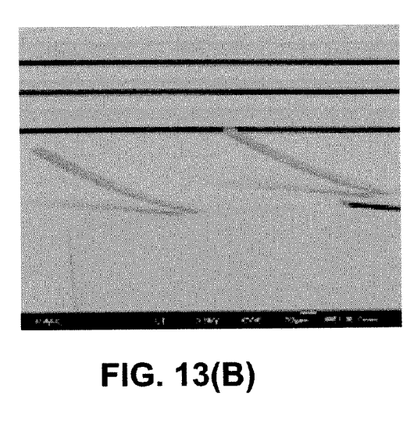
Figure 13C:
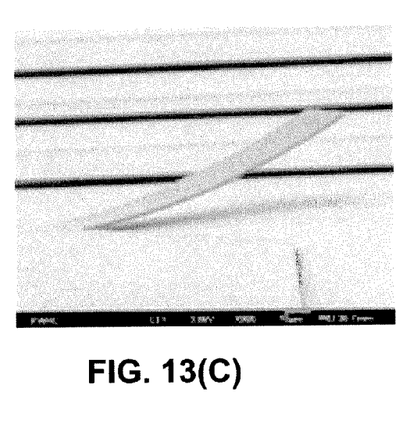

Prototypes of spring structures formed in accordance with the invention were produced by the inventors and inspected by SEM. To illustrate the potential of the encapsulation method, the inventors used Ni as metal for both release and spring layer. That is, only two materials were needed to produce the spring structures using the production method (one material for encapsulation, the other material for the release and spring layers). In a process using oxidation for encapsulation, it may even be possible to use only one material to produce a spring structure. FIGS. 12(A) to 12(C) show SEM images of encapsulated springs after release etching. Note that the encapsulation structure is still in place. The release layer in these examples is Ni deposited by electroless plating (note that the Ni contains a few percent of P). The spring metal is Ni deposited by electroplating. The encapsulation structure is Au deposited by electroplating. The structure was fabricated using the full encapsulation method described above. FIGS. 13(A) to 13(C) show SEM images of the spring structures of FIGS. 12(A) to 12(C) after the encapsulation structure was removed by etching. It was observed during fabrication that an annealing step at 100-150° C. improves the sealing properties of the encapsulation structure considerably.

Figure 14A:
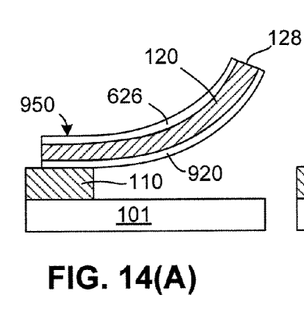
FIGS. 14(A), 14(B) and 14(C) are cross-sectional side views showing portions of a capillary-type micro-machined structure according to another embodiment of the present invention.
Figure 14B:
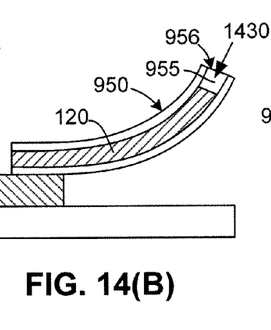
Figure 14C:
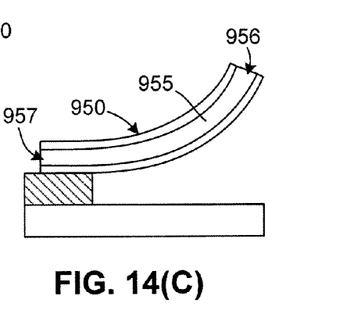

As set forth in the examples above, the encapsulation structure can be maintained on the beam as part of the completed micro-machined structure, or can be removed after the release process. FIGS. 14(A) to 14(C) show portions of a production method according to another embodiment in which a full encapsulation structure is retained to form a partial or full capillary structure. FIG. 14(A) shows a beam 120 that is supported on a base section 110 and has a full encapsulation structure 950 formed thereon in the manner described above (upper layer 626 and lower layer 920 are shown), with the only difference being that masking is used to prevent the formation of encapsulation material over tip 128. Note that beam 120 has bent away from substrate 101 due to the mechanisms described above. In FIG. 14(B), an etchant 1430 removes the tip section of beam 120, thus defining a partial capillary 955 having a front opening 956. In FIG. 14(C), etching may continue and/or be performed at both ends of encapsulation structure 950 to form a completely hollow capillary (conduit) structure extending from front opening 956 to a rear opening 957. Note that additional material might be deposited between beam 120 and encapsulation structure 950 to facilitate the subsequent removal of beam 120.

Figure 15:
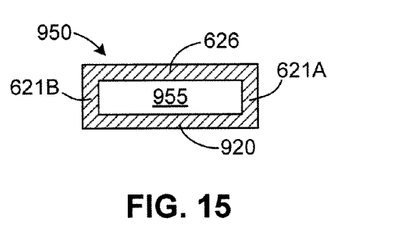
FIG. 15 is a cross-sectional end view showing the capillary-type micro-machined structure of FIG. 14(C)
Figure 16A:
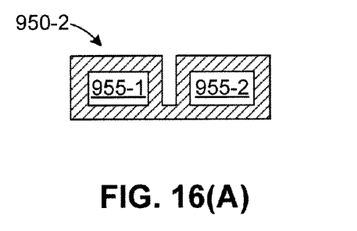
FIGS. 16(A), 16(B) and 16(C) are cross-sectional end views showing various capillary-type micro-machined structures according to additional embodiments of the present invention.
Figure 16B:
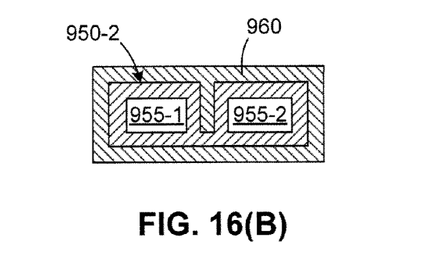
Figure 16C:
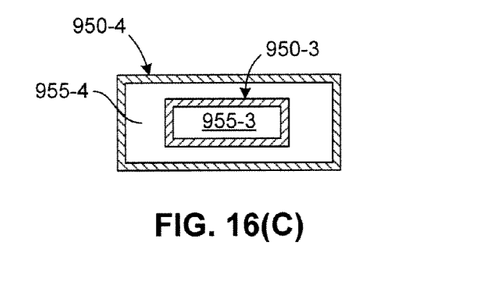

FIG. 15 is a cross-sectional end view showing encapsulation/capillary structure 950 in which rectangular capillary 955 is defined by lower encapsulation layer 920, side walls 621A and 621B, and upper encapsulation layer 626. Those skilled in the art will recognize that multiple alternatives to the basic structure shown in FIG. 15 are possible, and FIGS. 16(A), 16(B), and 16(C) are provided to illustrate exemplary alternative capillary structures. FIG. 16(A) shows a capillary structure 950-2 including multiple capillaries 955-1 and 955-2 that are formed in the manner described above. FIG. 16(B) shows capillary structure 950-2 with an additional material coating 960 that is provided e.g., for channel stiffening passivation. FIG. 16(C) shows yet another example in which an inner encapsulation structure 950-3, which defines a first capillary 955-3, is formed inside of an outer encapsulation structure 950-4, which defines a second capillary 955-4, such that first capillary 955-3 and second capillary 955-4 are concentric.

Figure 17A:
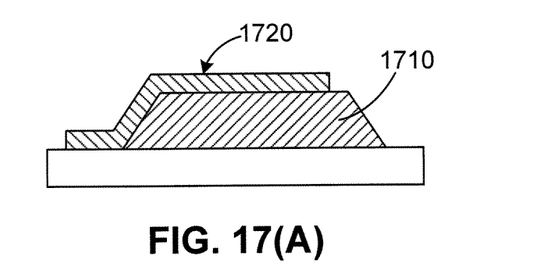
FIGS. 17(A), 17(B) and 17(C) are cross-sectional side views showing the production of a probe-type micro-machined spring structure according to another embodiment of the present invention.
Figure 17B:
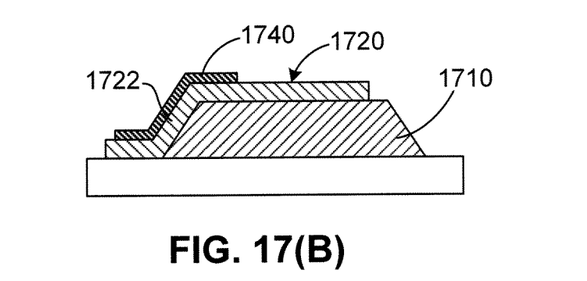
Figure 17C:
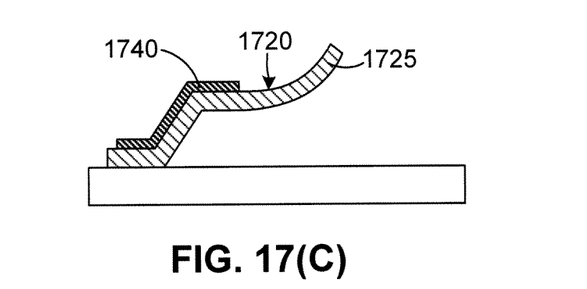

Spring encapsulation allows for very thick plated release layers, and hence spring structures might be fabricated on high wedges or pedestals. An example of such a process is illustrated in FIGS. 17(A) to 17(C), where a wedge-shaped release structure 1710 is deposited and patterned using known techniques, and then a spring structure is formed thereon (FIG. 17(A)). A load layer 1740 is then formed on an anchor portion 1722 of spring structure 1720 (FIG. 17(B)), and then the release structure is removed (etched), causing the non-loaded free portion 1725 of spring structure 1720 to bend relative to the underlying substrate. This modified production method allows for different spring shapes that can be of advantage for probing applications.

The use of stress-engineered metal tips as sliding-contact interconnects requires materials with high electrical conductivity (e.g., gold) which are often prone high wear. Adding a hard and durable coating to the tip on its sides could help improve wear resistance significantly. This coating might be formed by one of the encapsulation structures described above, or might be deposited before or after encapsulation.

The encapsulation structure might be used to increase the functionality of a spring structure. For example, the encapsulating material could be bio-reactive in order to interact with specific bio-agents. Of even more importance could be an encapsulating material that is not bio-reactive to specified agents such that, when exposed to the material, the material will only attach to the exposed plane on the front tip of the spring.

Although the present invention has been described with respect to certain specific embodiments, it will be clear to those skilled in the art that the inventive features of the present invention are applicable to other embodiments as well, all of which are intended to fall within the scope of the present invention. For example, the spring encapsulation method might also be used to produce spring structures in which the stress-gradient of a stress-engineered film is produced such that the resulting bent beam structure points toward the substrate instead of away from it. In this case, spring encapsulation and spring deposition is done first and the release layer is deposited only afterwards. Further, although the spring encapsulation method is especially interesting for a plating process, it might also be used with other methods such as sputtering or PECVD.

The invention claimed is:

1. A capillary structure comprising:
    a substrate;
    a hollow encapsulation structure including an anchor portion attached to the substrate and a free end portion extending over the substrate and curving away from the substrate,
    wherein the hollow encapsulation structure comprises a lower wall, an upper wall, and parallel side walls extending between the lower wall and the upper wall such that the lower, upper and parallel side walls form a substantially rectangular cross-section forming a hollow conduit extending between a first opening defined at the free end portion and a second opening,
    wherein the lower, upper and parallel side walls consist essentially of an encapsulation material such that said hollow encapsulation structure is formed solely by the encapsulation material, and
    wherein the encapsulation material consists essentially of at least one of an oxide, a nitride, a resist layer, a polymer layer and an electrically conductive material.

2. The capillary structure of claim 1, wherein the encapsulation material consists essentially of at least one of an oxide and a nitride.

3. The capillary structure of claim 2, wherein each of the lower, upper and parallel side walls has a thickness in the range of 5-100 nm.

4. The capillary structure of claim 1, wherein the encapsulation material consists essentially of at least one of a resist layer and a polymer layer.

5. The capillary structure of claim 4, wherein each of the lower, upper and parallel side walls has a thickness in the range of 0.1 to 1 µm.

6. The capillary structure of claim 1, wherein the encapsulation material consist essentially of plated gold.

7. A capillary structure comprising:
    a substrate;
    a hollow encapsulation structure including an anchor portion attached to the substrate and a free end portion extending over the substrate and curving away from the substrate,
    wherein the hollow encapsulation structure comprises a lower wall, an upper wall, and parallel side walls extending between the lower wall and the upper wall such that the lower, upper and parallel side walls form a cross-section defining a hollow conduit that extends between a first opening defined at the free end portion and a second opening, and
    wherein the lower, upper and parallel side walls consist essentially of an encapsulation material consisting essentially of at least one of an oxide, a nitride, a resist layer, a polymer layer and plated gold.

8. The capillary structure of claim 7, wherein the encapsulation material consists essentially of at least one of an oxide and a nitride.

9. The capillary structure of claim 8, wherein each of the lower, upper and parallel side walls has a thickness in the range of 5-100 nm.

10. The capillary structure of claim 7, wherein the encapsulation material consists essentially of at least one of a resist layer and a polymer layer.

11. The capillary structure of claim 10, wherein each of the lower, upper and parallel side walls has a thickness in the range of 0.1 to 1 µm.

12. The capillary structure of claim 7, wherein the encapsulation material consists essentially of plated gold.

13. The capillary structure of claim 7, further comprising an additional material coating disposed over the hollow encapsulation structure.

14. The capillary structure of claim 7, wherein at least one of the additional material coating and the encapsulation material consists essentially of at least one of an oxide and a nitride and has a thickness in the range of 5-100 nm.

15. The capillary structure of claim 7, wherein at least one of the additional material coating and the encapsulation material consists essentially of at least one of a resist layer and a polymer layer and has a thickness in the range of 0.1 to 1 µm.

16. The capillary structure of claim 7, wherein at least one of the additional material coating and the encapsulation material consists essentially of plated gold.

* * * * *